US008078447B2

(12) United States Patent
Tutuianu et al.

(10) Patent No.: US 8,078,447 B2
(45) Date of Patent: Dec. 13, 2011

(54) CHARGE-BASED MILLER COEFFICIENT COMPUTATION

(75) Inventors: Bogdan Tutuianu, The Hills, TX (US); Iris E. Chen, Los Altos, CA (US); Jiyang Cheng, Stanford, CA (US)

(73) Assignee: Oracle America, Inc., Redwood City, CA (US)

( * ) Notice: Subject to any disclaimer, the term of this patent is extended or adjusted under 35 U.S.C. 154(b) by 760 days.

(21) Appl. No.: 12/141,638

(22) Filed: Jun. 18, 2008

(65) Prior Publication Data

US 2009/0319254 A1 Dec. 24, 2009

(51) Int. Cl.
*G06F 17/50* (2006.01)
*G06F 9/455* (2006.01)

(52) U.S. Cl. ......................................... 703/14; 716/113
(58) Field of Classification Search .................. 703/14; 716/113
See application file for complete search history.

(56) References Cited

U.S. PATENT DOCUMENTS

| 6,665,845 | B1 * | 12/2003 | Aingaran et al. | 716/113 |
| 7,739,640 | B2 * | 6/2010 | Abbaspour et al. | 716/113 |
| 2004/0034840 | A1 * | 2/2004 | Chen | 716/6 |
| 2006/0059446 | A1 * | 3/2006 | Chen et al. | 716/6 |

OTHER PUBLICATIONS

Chen et al. "Miller Factor for Gate-Level Coupling Delay Calculation", IEEE 2000., p. 68-74.*
Chen et al. "Closed-Form Crosstalk Noise Delay Metrics". Analog Integrated Circuits and Signal Processing., 2003, p. 143-156.*
Mayergoyz et al. "Basic Electric Circuit Theory"., Academic Press., 1997, p. 107-110.*
Kulkarni et al. "A sensitivity-Based Approach to Analyzing Signal Delay Uncertainty of coupled Interconnects"., IEEE. Sep. 2005., p. 1336-1346.*

* cited by examiner

*Primary Examiner* — Paul Rodriguez
*Assistant Examiner* — Eunhee Kim
(74) *Attorney, Agent, or Firm* — Osha • Liang LLP

(57) ABSTRACT

A method of estimating a Miller coefficient for an aggressor network and a victim network coupled by a coupling capacitor includes synthesizing a reduced order system from the aggressor network and the victim network, estimating an active area across the coupling capacitor for an aggressor induced noise signal based on the reduced order system, calculating an estimate of the Miller coefficient based on the active area of the aggressor induced noise signal, and outputting the calculated estimate of the Miller coefficient.

17 Claims, 5 Drawing Sheets

CHARGE-BASED MILLER COEFFICIENT COMPUTATION

BACKGROUND OF INVENTION

1. Field of the Invention

Embodiments disclosed herein generally relate to the field of timing analysis in large scale circuit designs such as microprocessors. More specifically, embodiments disclosed herein relate to a method of estimating a Miller coefficient used for estimating the impact of noise on the timing of a circuit.

2. Description of the Related Art

Timing analysis is an important component for maintaining signal integrity through large scale circuit designs such as microprocessors. Various signal paths may interact with each other, creating noise in the signal paths that create timing delays in the various signals. Designers account for these delays by creating a worst case model for the timing delays. One model for accounting for noise delays is to consider a victim signal path to be coupled to an aggressor signal path through a coupling capacitor. The impact of the aggressor path noise on the victim path may then be estimated by decoupling the networks and scaling the coupling capacitor values by a so-called Miller coefficient.

SUMMARY OF THE INVENTION

In one aspect, embodiments disclosed herein relate to a method of estimating a Miller coefficient for an aggressor network and a victim network coupled by a coupling capacitor that includes synthesizing a reduced order system from the aggressor network and the victim network, estimating an active area across the coupling capacitor for an aggressor induced noise signal based on the reduced order system, calculating an estimate of the Miller coefficient based on the active area of the aggressor induced noise signal, and outputting the calculated estimate of the Miller coefficient.

In another aspect, embodiments disclosed herein relate to a method of estimating a Miller coefficient for an aggressor network and a victim network coupled by a coupling capacitor that includes determining a start time, an end time, and a mean time of arrival for a victim signal across the coupling capacitor assuming a quiet aggressor input, synthesizing a reduced order system from the aggressor network and the victim network, estimating a mean time of arrival across the coupling capacitor for an aggressor induced noise signal based on a transfer function of the reduced order system, deriving a shifted noise signal by shifting the aggressor induced noise signal based on a mean time of arrival of the victim signal and a mean time of arrival of the aggressor induced noise signal, calculating an active area bound by the shifted noise signal between the start time and the end time, calculating an estimate of the Miller coefficient based on the active area bound by the shifted noise signal, and outputting the calculated estimate of the Miller coefficient.

In yet another aspect, embodiments disclosed herein relate to a computer readable medium embodying instructions executable by the computer to perform method steps for estimating a Miller coefficient for an aggressor network and a victim network coupled by a coupling capacitor. The instructions include functionality to synthesize a reduced order system from the aggressor network and the victim network, estimate an active area across the coupling capacitor for an aggressor induced noise signal based on the reduced order system, and calculate an estimate of the Miller coefficient based on the active area of the aggressor induced noise signal.

Finally, embodiments disclosed herein relate to a computer readable medium embodying instructions executable by the computer to perform method steps for estimating a Miller coefficient for an aggressor network and a victim network coupled by a coupling capacitor. The instructions include functionality to determine a start time, an end time, and a mean time of arrival for a victim signal across the coupling capacitor assuming a quiet aggressor input, synthesize a reduced order system from the aggressor network and the victim network, estimate a mean time of arrival across the coupling capacitor for an aggressor induced noise signal based on a transfer function of the reduced order system, derive a shifted noise signal by shifting the aggressor induced noise signal based on a mean time of arrival of the victim signal and a mean time of arrival of the aggressor induced noise signal, calculate an active area bound by the shifted noise signal between the start time and the end time, and calculate an estimate of the Miller coefficient based on the active area bound by the shifted noise signal.

Other aspects and advantages of the present disclosure will be apparent from the following description and the appended claims.

DETAILED DESCRIPTION

Figure 1A:
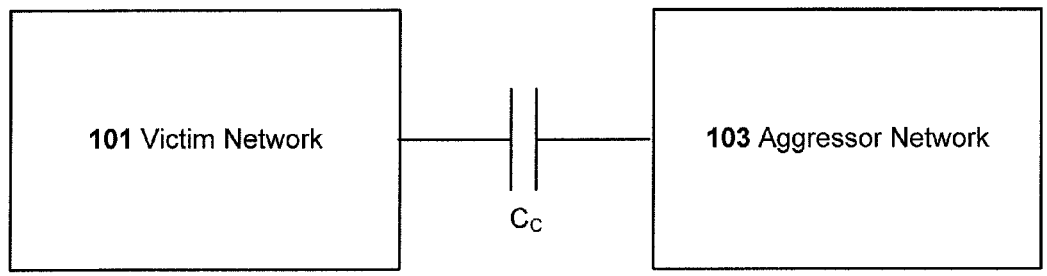
FIG. 1(a) shows a block diagram of a coupled circuit model according to embodiments disclosed herein.

Specific embodiments of the present disclosure will now be described in detail with reference to the accompanying figures. Like elements in the various figures may be denoted by like reference numerals for consistency. Further, in the following detailed description of embodiments of the present disclosure, numerous specific details are set forth in order to provide a more thorough understanding of the invention. However, it will be apparent to one of ordinary skill in the art that the embodiments disclosed herein may be practiced without these specific details. In other instances, well-known features have not been described in detail to avoid unnecessarily complicating the description.

In one aspect, embodiments disclosed herein generally relate to a method of estimating a Miller coefficient between a victim network coupled to an aggressor network. The Miller coefficient allows for simple estimation of timing delays through a circuit due to coupling noise.

Referring now to FIG. 1(a), a block diagram of a model used in embodiments disclosed herein is shown. The figure models a victim network 101 coupled through a coupling capacitor Cc to an aggressor network 103. Signals from the aggressor network 103 may leak through the coupling capacitor, thereby affecting the integrity of signals in the victim network 101. On an actual chip, static timing analysis of the victim network 101 and the aggressor network 103 may give information about the signal propagation of each network individually, but there is no topological information about where a coupling interaction may occur between the two networks. Accordingly, timing analysis of the coupled system must be based on information that is readily available, such as the worst case victim network transition time and the worst case transfer function characteristics of each network. The worst case transfer function characteristics may include, for example, worst case mean transfer delay or arrival time and worst case variance.

Figure 1B:
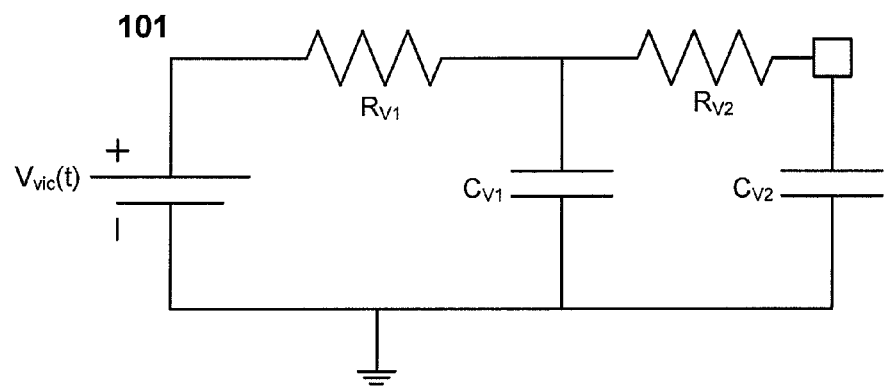
FIG. 1(b) shows a circuit diagram of a reduced order model according to embodiments disclosed herein.

Referring now to FIG. 1(b), a circuit diagram of a reduced order model of the victim network 101 used in embodiments disclosed herein is shown. The reduced order model is based on available information regarding the victim network, including the worst case transfer function characteristics such as mean transfer delay and variance and the total capacitance of the victim network. In order to construct the second order model shown in FIG. 1(b), the following linear system of equations may be derived from assuming that the two resistors have equal values and assuming that the total capacitance, mean transfer delay, and variance are equal to the original values measured from the victim network. The second order model maintains the worst case mean transfer delay and worst case variance from the victim network.

$$R_{V1}=R_{V2}$$

$$C_T=C_{V1}+C_{V2}$$

$$m_1=R_{V1}*(C_T+C_{V2})$$

$$\mu_2=R_{V1}^2*(C_T^2+3*C_{V2}^2)$$

Given $C_T$, $m_1$, and $\mu_2$, the values of $C_{V1}$, $C_{V2}$, $R_{V1}$, and $R_{V2}$ may be calculated. However, certain systems may not have real solutions for this second order model. In these cases, a first order model with a single resistor $R_{V1}$ and a single capacitor $C_{V1}$ may be used instead based on the following explicit definitions. The first order model maintains the worst case mean transfer delay from the victim network, but not necessarily the worst case variance.

$$C_{V1}=C_T$$

$$m_1=R_{V1}*C_{V1}$$

Figure 1C:
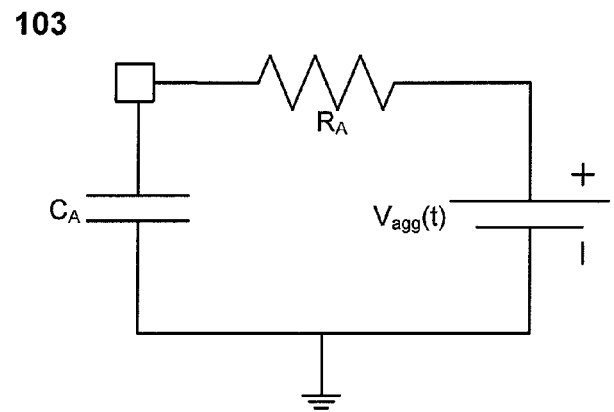
FIG. 1(c) shows a circuit diagram of a reduced order model according to embodiments disclosed herein

Referring now to FIG. 1(c), a circuit diagram of a reduced order model of the aggressor network 103 used in embodiments disclosed herein is shown. The model shown here is analogous to the case discussed above with respect to a first order model of the victim network 101. The model comprises a single resistor $R_A$ single capacitor $C_A$. The values of $R_A$ and $C_A$ may be calculated from the total capacitance $C_T$ and the worst case mean transfer delay $m_1$ of the original aggressor network based on the following explicit definitions.

$$C_A=C_T$$

$$m_1=R_A*C_A$$

Figure 2:
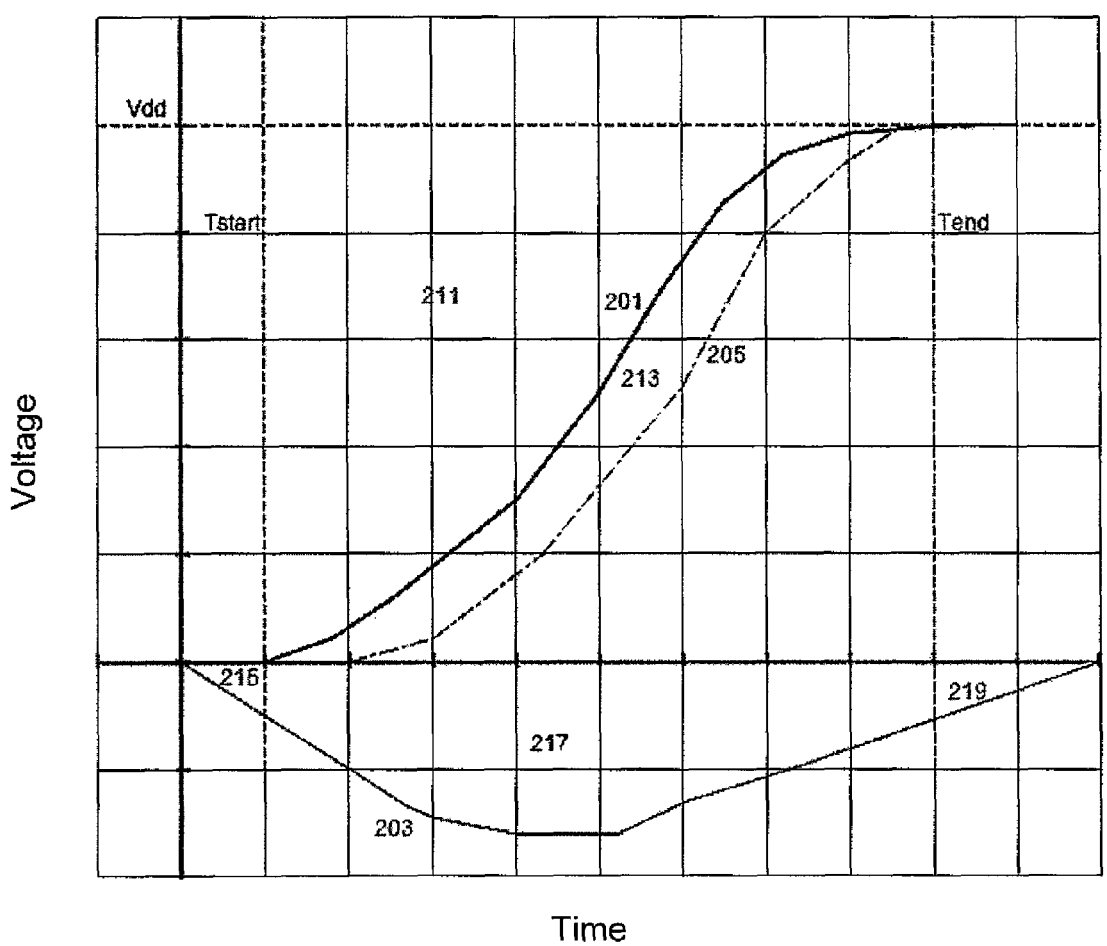
FIG. 2 shows a graph of signals across a coupling capacitor according to embodiments disclosed herein.

Referring now to FIG. 2, an exemplary graph of a signal propagating through a circuit is shown. A victim signal 201 represents a victim signal with no interaction from a noisy aggressor network. FIG. 2 also shows an aggressor induced signal 203 that represents an example noise pulse measured with a quiet victim network that affects the integrity of the victim signal 201. A resulting signal 205 represents the victim signal 201 in the presence of the aggressor induced signal 203 from the coupled aggressor network. Tstart represents the beginning of the victim signal 201 and Tend represents the saturation point of the victim signal 201.

FIG. 2 also labels the areas 211, 213, 215, 217, and 219 bound by the victim signal 201, the aggressor induced signal 203, and the resulting signal 205. The relative sizes of these areas may be used to determine the impact of the aggressor induced signal 203 on the victim signal 201, and estimate a Miller coefficient to estimate how various coupling capacitances may affect the victim signal 201. For example, the area 211 bound on the lower side by the victim signal 201 represents the mean charging time across the coupling capacitor $C_c$ due to a current $I_{vic(t)}$ from the victim signal 201 alone.

The sum of the area 211 and the area 213 bound on the lower side by the resulting signal 205 represents a mean charging time across the coupling capacitor $C_c$ due to the current $I_{vic}(t)$ and a current $I_{agg}(t)$ from the combination of the victim signal 201 and the aggressor induced signal 203. Therefore, the area 213 represents the effect of the aggressor induced signal 203 on the victim signal 201. The area 213 may be estimated based on the area of the aggressor induced signal 203 that affects the victim signal 201. Preferably, in order to obtain a more accurate result, only the area 217 of the aggressor induced signal 203 that lies between Tstart and Tend is used to estimate the effect of the aggressor induced signal 203 on the victim signal 201. The following equations reflect the actual calculation of these areas, assuming that $V_{dd}$ is unity for simplicity and each Area function is bound by Tstart and Tend. $V_{vic}(t)$ represents a victim signal without the presence of noise, and $V_{noise}(t)$ represents an estimate of an aggressor induced noise signal that has propagated through the reduced order model outlined above.

$$MeanTime[I_{vic(t)}+I_{agg(t)}]=\frac{\int_{Tstart}^{Tend} t*Cc*\left(\frac{dV_{vic}}{dt}-\frac{dV_{noise}}{dt}\right)dt}{\int_{Tstart}^{Tend} Cc*\left(\frac{dV_{vic}}{dt}+\frac{dV_{noise}}{dt}\right)dt}$$

$$MeanTime[I_{vic(t)}+I_{agg(t)}]=Area[1-(V_{vic}(t)-V_{noise}(t))]$$

$$MeanTime[I_{vic(t)}+I_{agg(t)}]=Area[1-V_{vic}(t)]+Area[V_{noise}(t)]$$

Thus, the area 213 may be found by calculating the active area 217 which is equivalent to the above Area[$V_{noise}(t)$]. From this calculation, a Miller coefficient relating the victim network to the aggressor network may be explicitly calculated from the following equations. The Miller coefficient provides a factor that will scale the effects of any sized coupling capacitor $C_c$ between the victim network and the aggressor network.

$$Area[V_{noise}(t)]=(R_{V1}+R_{V2})*\mu*C_c$$

$$MillerCoefficient=1+\mu$$

However, the above described calculation of the active area 217 does not necessarily ensure that the aggressor induced signal 203 has a worst case effect on the mean arrival time of the victim signal 201. In order to maximize the effect of the noise pulse on the mean arrival time of the victim signal 201, the aggressor induced signal 203 may be shifted so that the original mean arrival time of each of the signals is the same. Preferably, the aggressor induced signal 203 is shifted by some factor $\Delta t$ before the active area Area[$V_{noise}(t)$] is calculated in order to align the mean arrival times of the victim signal 201 and the shifted aggressor induced signal. Again assuming a unity $V_{dd}$, the calculations for the Miller coefficient including a time shift in the aggressor induced signal 203 follow.

$$\text{Area}[V_{noise}(t)] = \int_{Tend}^{Tstart} V_{noise}(t - \Delta t) dt$$

$$\text{Area}[V_{noise}(t)] = (R_{v1} + R_{v2}) * \mu * C_c$$

$$\text{MillerCoefficient} = 1 + \mu$$

Figure 3:
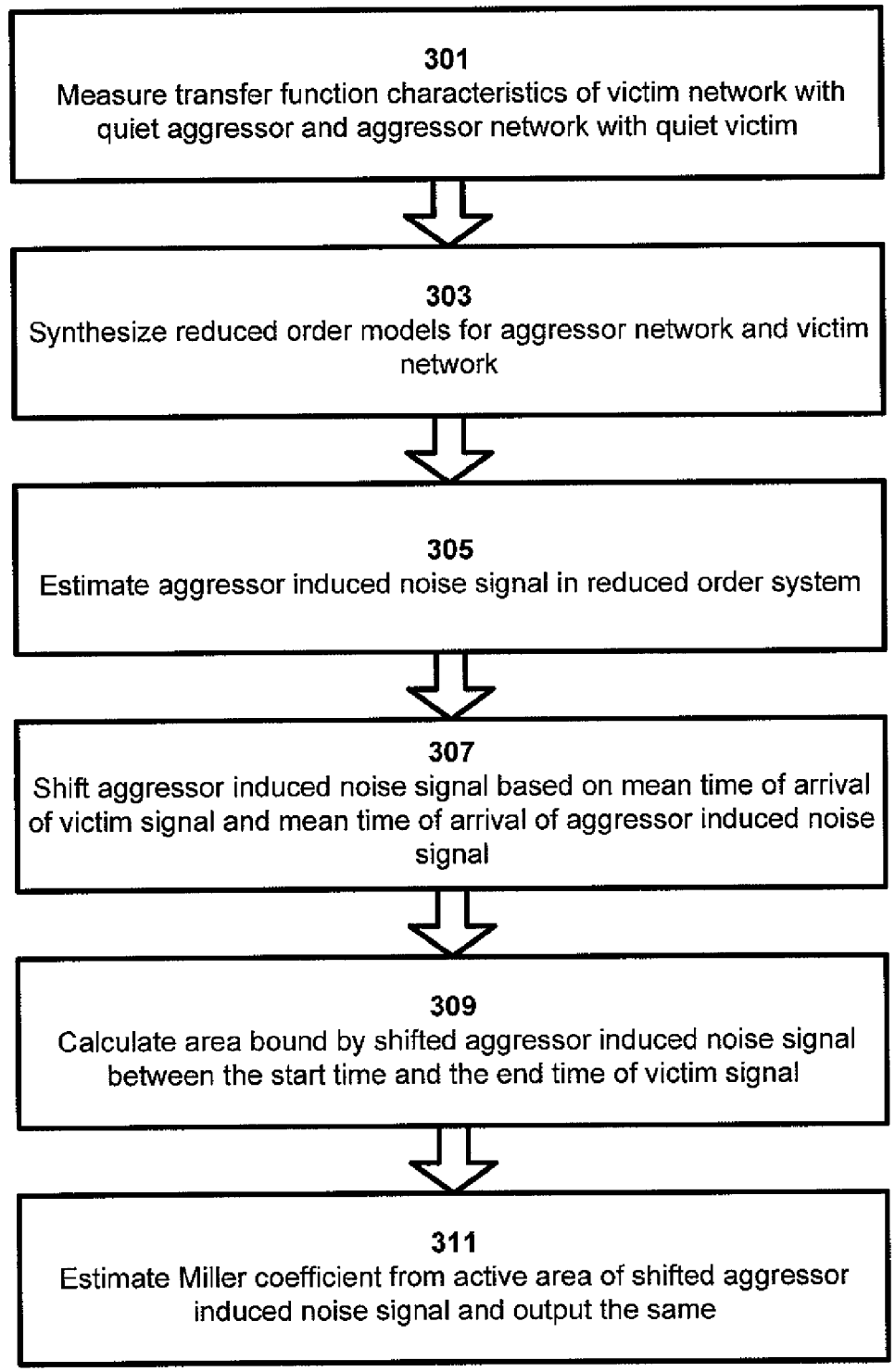
FIG. 3 shows a flow chart of a method according to embodiments disclosed herein.

Referring now to FIG. 3, a flow chart 300 outlining a method of estimating a Miller coefficient disclosed herein is shown. The first step 301 comprises measuring $V_{vic}(t)$ in a victim network with a quiet aggressor network and $V_{agg}(t)$ in an aggressor network with a quiet victim network. Measuring these signals involves static timing analysis in order to determine the worst case victim transfer function characteristics, including worst case mean transfer delay or worst case mean charging time and worst case variance. Step 303 comprises synthesizing reduced order models for the victim network and the aggressor network based on the transfer function characteristics measured in step 301. Step 305 comprises estimating an aggressor induced noise signal based on the reduced order model synthesized in step 303. The aggressor induced noise signal may be estimated analytically through convolution. Specifically, convolving the $V_{agg}(t)$ with the known transfer function of the reduced order model results in an estimate of the aggressor induced noise signal $V_{noise}(t)$.

Next, step 307 comprises shifting the estimated aggressor induced noise signal $V_{noise}(t)$ based on the mean arrival times of charging for the victim signal and the aggressor induced signal. Preferably, the aggressor induced noise signal $V_{noise}(t)$ is shifted by some time $\Delta t$ such that the mean arrival time, also known as the Elmore delay, of the shifted noise signal is aligned with the mean arrival time, or Elmore delay, of the victim signal. If the two arrival times cannot be fully aligned due to timing window limits, the closest alignment to the victim mean is chosen. Step 309 comprises calculating the active area of the now shifted aggressor induced noise signal $V_{noise}(t-\Delta t)$. The active area is defined by the start and end times of the victim signal. Finally, step 311 comprises explicitly calculating a Miller coefficient estimate from this active area and outputting the same.

Figure 4:
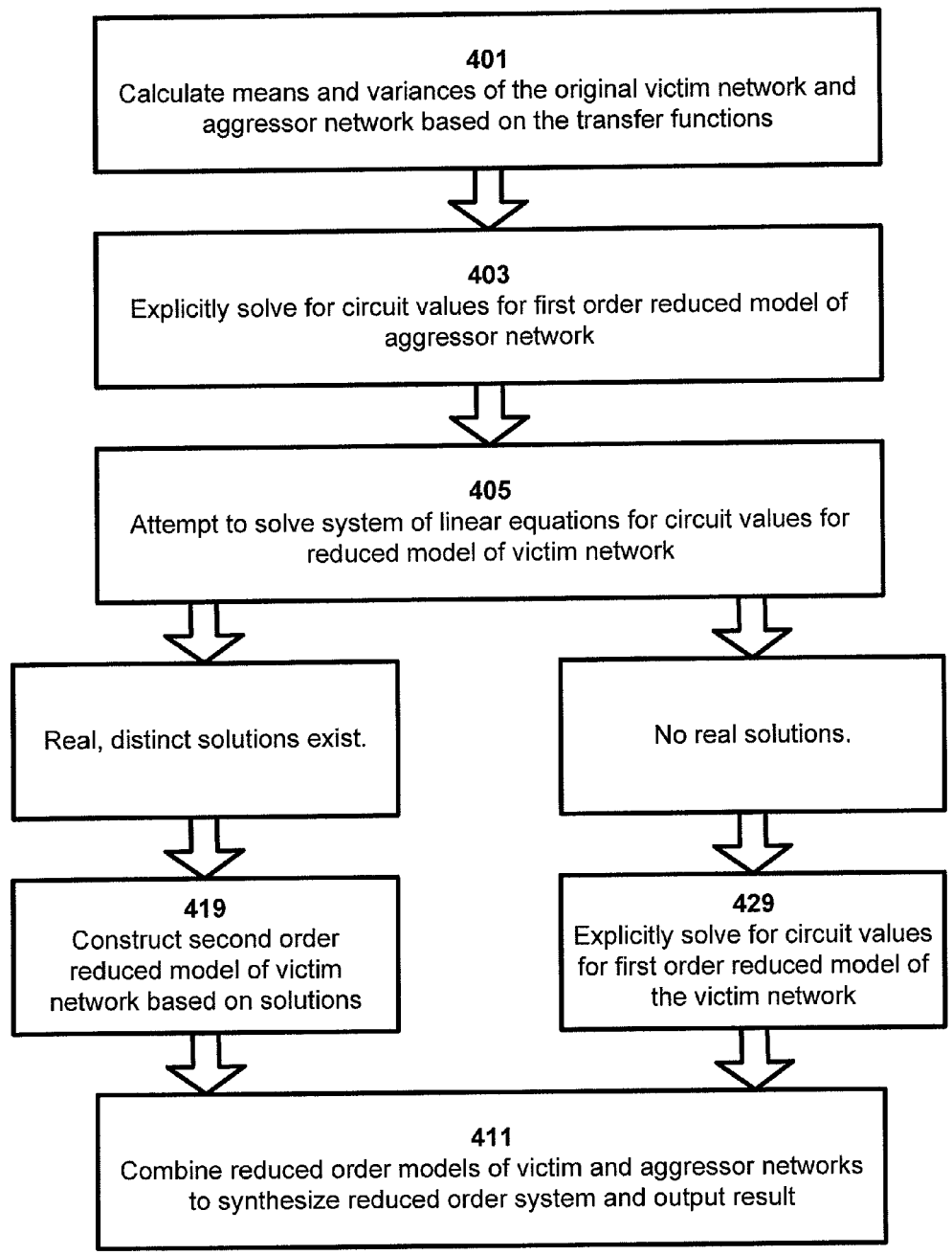
FIG. 4 shows a flow chart of a method according to embodiments disclosed herein.

Referring now to FIG. 4, a flow chart 303 outlining a method of synthesizing reduced order models for an aggressor network and a victim network disclosed herein is shown. The first step 401 comprises calculating the means and variances of the original victim network and aggressor network transfer functions based on measured transfer functions. Alternatively, the means and variances may be directly measured, as discussed above. Step 403 comprises explicitly solving for the circuit values of a first order reduced model of the aggressor network based on the calculated mean of the aggressor network transfer function. Step 405 comprises attempting to solve the system of linear equations based on the calculated mean, variance, and a measured total capacitance for a second order model of the victim network. If distinct, real solutions exist, then step 419 comprises constructing the second order model based on the solutions. However, if no solutions exist, then step 429 comprises explicitly solving for the circuit values of a first order reduced model of the aggressor network similarly to the aggressor network. Finally, step 411 comprises synthesizing a reduced order system comprising the reduced order victim network and the reduced order aggressor network and outputting the result.

The methods disclosed herein may be implemented, for example, by hardware or software modules for performing each of the steps. For example, each of the steps shown in FIGS. 3 or 4 may be implemented by a separate hardware or software module. In order to implement each step in a hardware module, a specialized circuit design or a programmable logic device, such as a field programmable gate array ("FPGA") may be used.

Figure 5:
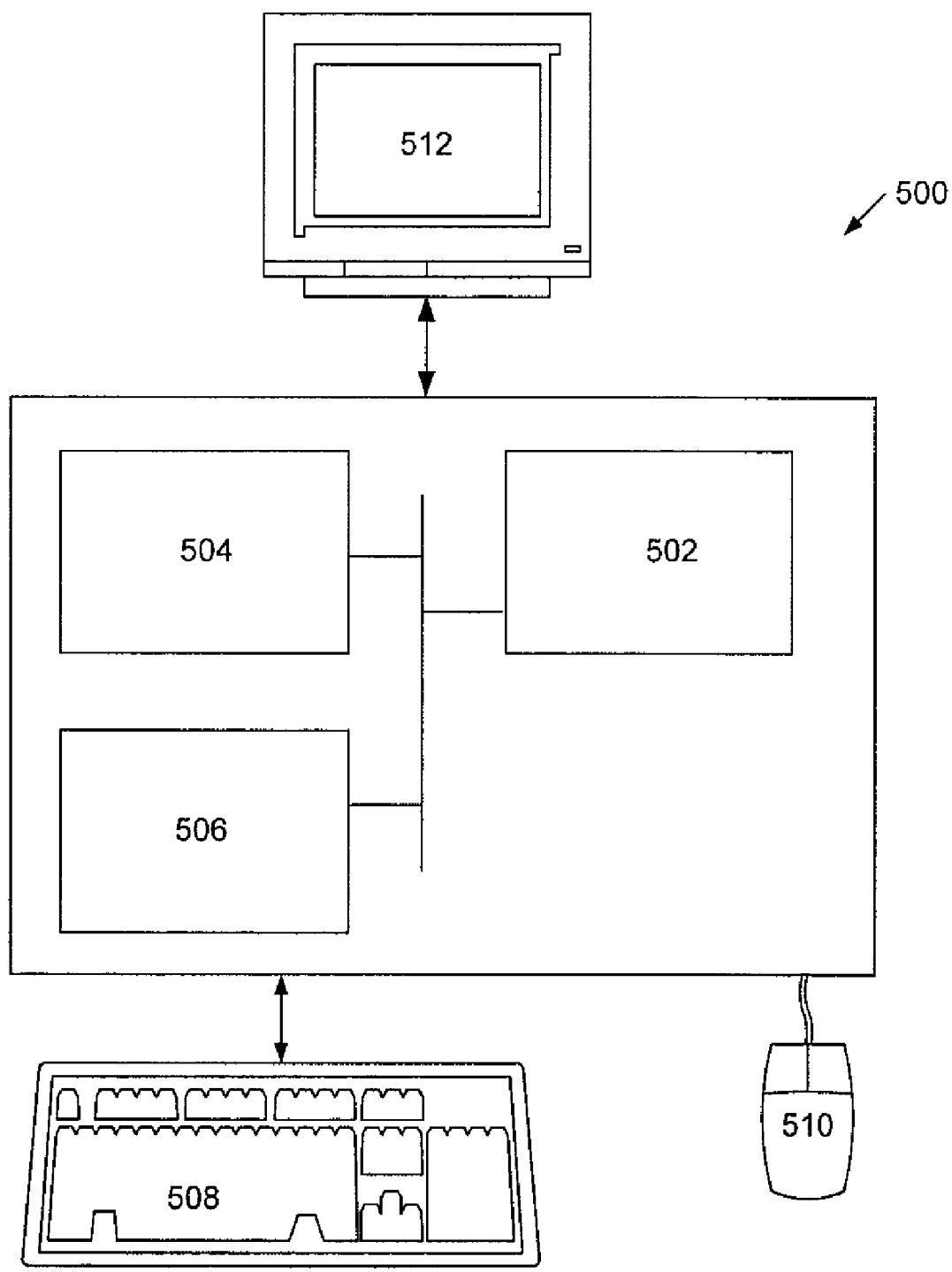
FIG. 5 shows a computer system in accordance with one or more embodiments of the invention.

Software modules may be implemented on virtually any type of computer regardless of the platform being used. For example, as shown in FIG. 5, a computer system 500 includes a processor 502, associated memory 504, a storage device 506, and numerous other elements and functionalities typical of today's computers (not shown). The computer 500 may also include input means, such as a keyboard 508 and a mouse 510, and output means, such as a monitor 512. The computer system 500 is connected to a local area network (LAN) or a wide area network (e.g., the Internet) (not shown) via a network interface connection (not shown). Those skilled in the art will appreciate that these input and output means may take other forms.

Further, those skilled in the art will appreciate that one or more elements of the aforementioned computer system 500 may be located at a remote location and connected to the other elements over a network. Further, the invention may be implemented on a distributed system having a plurality of nodes, where each portion of the invention (e.g., directories in directory structure, file system engine, file system, active document, index, etc.) may be located on a different node within the distributed system. In one embodiment of the invention, the node corresponds to a computer system. Alternatively, the node may correspond to a processor with associated physical memory. The node may alternatively correspond to a processor with shared memory and resources. Further, software instructions to perform embodiments of the invention may be stored on a computer readable medium such as a compact disc (CD), a diskette, a tape, a file, or any other computer readable storage device.

Embodiments disclosed herein may provide for one or more of the following advantages. First the reduced order models used herein may provide for more realistic estimates of noise pulse waveforms. Next, aligning the mean arrival times between the victim signal and the noise pulse signal may maximize the deviation in the mean arrival time of the resulting signal. Further, determining the active area of the noise pulse signal based on the start and end times of the victim signal may allow for more accurate computations of the Miller coefficient. Determining the contribution of aggressor activity to victim net delay based on mean time of charging maintains linearity in the computation, thereby allowing the cumulative effects of multiple aggressor networks to be combined without accounting for the order or position of the aggressor networks. Finally, the techniques disclosed herein may provide for a significant reduction in the error of delay in timing estimations based on a calculated Miller coefficient.

While the present disclosure has been described with respect to a limited number of embodiments, those skilled in the art, having benefit of this disclosure, will appreciate that other embodiments may be devised which do not depart from the scope of the disclosure as described herein. Accordingly, the scope of the disclosure should be limited only by the attached claims.

What is claimed is:

1. A method of estimating a Miller coefficient for an aggressor network and a victim network coupled by a coupling capacitor, comprising:
   synthesizing a reduced order system from the aggressor network and the victim network;

estimating an active area across the coupling capacitor for an aggressor induced noise signal based on the reduced order system;

calculating an estimate of the Miller coefficient based on the active area of the aggressor induced noise signal; and outputting the calculated estimate of the Miller coefficient.

2. The method of claim 1, further comprising:

determining a start time, an end time, and a mean time of arrival for a victim signal across the coupling capacitor assuming a quiet aggressor input;

shifting the aggressor induced noise signal based on the mean time of arrival across the coupling capacitor of the victim signal; and estimating the active area of the aggressor induced noise signal based on the start time and end time of the victim signal.

3. The method of claim 1, wherein shifting the aggressor induced noise signal comprises matching the mean time of arrival of the shifted noise signal to the mean time of arrival of the victim signal.

4. The method of claim 1, wherein calculating the estimate of the Miller coefficient comprises scaling the active area by a factor derived from circuit values in the reduced order system.

5. The method of claim 1, wherein synthesizing the reduced order system comprises creating a reduced order model of the aggressor network and a reduced order model of the victim network.

6. The method of claim 5, wherein creating the reduced order model of the aggressor network comprises creating a first order model of the aggressor network comprising one resistor and one capacitor.

7. The method of claim 5, wherein creating the reduced order model of the aggressor network comprises matching a mean value of a reduced order model transfer function to a mean value of an aggressor network transfer function.

8. The method of claim 5, wherein creating the reduced order model of the victim network comprises creating a second order model of the victim network comprising two resistors and two capacitors.

9. The method of claim 8, wherein the two resistors have equal values.

10. The method of claim 5, wherein creating the reduced order model of the victim network comprises matching a mean value of a reduced order model transfer function to a mean value of a victim network transfer function.

11. The method of claim 5, wherein creating the reduced order model of the victim network comprises matching a variance of a reduced order model transfer function to a variance of a victim network transfer function.

12. A method of estimating a Miller coefficient for an aggressor network and a victim network coupled by a coupling capacitor, comprising:

determining a start time, an end time, and a mean time of arrival for a victim signal across the coupling capacitor assuming a quiet aggressor input;

synthesizing a reduced order system from the aggressor network and the victim network;

estimating a mean time of arrival across the coupling capacitor for an aggressor induced noise signal based on a transfer function of the reduced order system;

deriving a shifted noise signal by shifting the aggressor induced noise signal based on the mean time of arrival of the victim signal and the mean time of arrival of the aggressor induced noise signal;

calculating an active area bound by the shifted noise signal between the start time and the end time;

calculating an estimate of the Miller coefficient based on the active area bound by the shifted noise signal; and outputting the calculated estimate of the Miller coefficient.

13. The method of claim 12, wherein deriving the shifted noise signal comprises shifting the aggressor induced noise signal to match the mean time of arrival of the shifted noise signal to the mean time of arrival of the victim signal.

14. The method of claim 12, wherein synthesizing the reduced order system comprises creating a reduced order model of the aggressor network and a reduced order model of the victim network.

15. A non-transitory computer readable medium, embodying instructions executable by the computer to perform method steps for estimating a Miller coefficient for an aggressor network and a victim network coupled by a coupling capacitor, the instructions comprising functionality to:

synthesize a reduced order system from the aggressor network and the victim network;

estimate an active area across the coupling capacitor for an aggressor induced noise signal based on the reduced order system; and calculate an estimate of the Miller coefficient based on the active area of the aggressor induced noise signal.

16. The non-transitory computer readable medium according to claim 15, further comprising functionality to:

determine a start time, an end time, and a mean time of arrival for a victim signal across the coupling capacitor assuming a quiet aggressor input;

shift the aggressor induced noise signal based on the mean time of arrival across the coupling capacitor of a victim signal; and estimate the active area of the aggressor induced noise signal based on the start time and end time of the victim signal.

17. A non-transitory computer readable medium, embodying instructions executable by the computer to perform method steps for estimating a Miller coefficient for an aggressor network and a victim network coupled by a coupling capacitor, the instructions comprising functionality to:

determine a start time, an end time, and a mean time of arrival for a victim signal across the coupling capacitor assuming a quiet aggressor input;

synthesize a reduced order system from the aggressor network and the victim network;

estimate a mean time of arrival across the coupling capacitor for an aggressor induced noise signal based on a transfer function of the reduced order system;

derive a shifted noise signal by shifting the aggressor induced noise signal based on the mean time of arrival of the victim signal and the mean time of arrival of the aggressor induced noise signal;

calculate an active area bound by the shifted noise signal between the start time and the end time; and calculate an estimate of the Miller coefficient based on the active area bound by the shifted noise signal.

\* \* \* \* \*